US012591042B2

(12) United States Patent
Zhang et al.

(10) Patent No.: US 12,591,042 B2
(45) Date of Patent: Mar. 31, 2026

(54) LIDAR

(71) Applicant: Hesai Technology Co., Ltd., Shanghai (CN)

(72) Inventors: Chao Zhang, Shanghai (CN); Shaoqing Xiang, Shanghai (CN)

(73) Assignee: Hesai Technology Co., Ltd., Shanghai (CN)

( * ) Notice: Subject to any disclaimer, the term of this patent is extended or adjusted under 35 U.S.C. 154(b) by 945 days.

(21) Appl. No.: 17/726,046

(22) Filed: Apr. 21, 2022

(65) Prior Publication Data

US 2022/0317256 A1 Oct. 6, 2022

Related U.S. Application Data

(63) Continuation of application No. PCT/CN2020/126268, filed on Nov. 3, 2020.

(30) Foreign Application Priority Data

Nov. 7, 2019 (CN) .......................... 201911084356.7
Nov. 7, 2019 (CN) .......................... 201911084362.2

(51) Int. Cl.
*G01S 7/481* (2006.01)
*H01S 5/024* (2006.01)
(Continued)

(52) U.S. Cl.
CPC .......... *G01S 7/4813* (2013.01); *G01S 7/4814* (2013.01); *H01S 5/02469* (2013.01); *H05K 1/0203* (2013.01); *H05K 7/20509* (2013.01)

(58) Field of Classification Search
None
See application file for complete search history.

(56) References Cited

U.S. PATENT DOCUMENTS 10,243,321 B2 * 3/2019 Reichert ............. H01S 5/02476
11,500,068 B2 * 11/2022 Lee ........................ G01S 7/4813
(Continued)

FOREIGN PATENT DOCUMENTS

CN 1790688 A 6/2006
CN 202362454 U 8/2012
(Continued)

OTHER PUBLICATIONS

English translation CN108828558—Espacenet (Year: 2019).*
(Continued)

*Primary Examiner* — Tod T Van Roy
(74) *Attorney, Agent, or Firm* — Wilson Sonsini Goodrich & Rosati

(57) ABSTRACT

A lidar is provided. The lidar comprises an emitting chamber, where at least one first printed circuit board and a film-shaped first heat dissipation component corresponding to the first printed circuit board is disposed therein. A laser emitter is disposed on the first printed circuit board which is configured to drive the laser emitter to emit a laser pulse. The first heat dissipation component includes a thermally conductive assembly portion and a heat dissipation assembly portion that are not coplanar. The thermally conductive assembly portion is attached on a back face of the first printed circuit board corresponding to the thermally conductive assembly portion. A portion of the heat dissipation assembly portion is connected to a chamber wall forming the emitting chamber. Temperature of the first printed circuit board is controlled to solve lidar reliability problem caused by overheating of the first printed circuit board.

18 Claims, 7 Drawing Sheets

100

(51) Int. Cl.
    H05K 1/02        (2006.01)
    H05K 7/20        (2006.01)

(56) References Cited

U.S. PATENT DOCUMENTS

| | | | | |
|---|---|---|---|---|
| 11,579,401 | B2 * | 2/2023 | Jang | G01S 17/08 |
| 12,010,822 | B2 * | 6/2024 | Holleczek | H02K 9/06 |
| 2020/0319307 | A1 * | 10/2020 | Huh | G03B 17/55 |
| 2021/0190918 | A1 * | 6/2021 | Li | G01S 7/4813 |
| 2022/0026198 | A1 * | 1/2022 | Pan | G01S 17/931 |
| 2022/0317256 | A1 * | 10/2022 | Zhang | H05K 7/20854 |

FOREIGN PATENT DOCUMENTS

| | | | | | |
|---|---|---|---|---|---|
| CN | 106443634 | A | | 2/2017 | |
| CN | 205956863 | U | | 2/2017 | |
| CN | 106814366 | A | | 6/2017 | |
| CN | 106908911 | A | | 6/2017 | |
| CN | 206629368 | U | | 11/2017 | |
| CN | 206684302 | U | | 11/2017 | |
| CN | 108490421 | A | * | 9/2018 | G01S 7/4811 |
| CN | 108761471 | A | * | 11/2018 | G01S 17/931 |
| CN | 108828558 | A | * | 11/2018 | G01S 7/4813 |
| CN | 108897006 | A | | 11/2018 | |
| CN | 208421227 | U | | 1/2019 | |
| CN | 109959913 | A | * | 7/2019 | G01S 7/481 |
| CN | 109991586 | A | | 7/2019 | |
| CN | 110673111 | A | | 1/2020 | |
| CN | 110780280 | A | | 2/2020 | |
| JP | 2008309562 | A | | 12/2008 | |
| KR | 101977315 | B1 | | 5/2019 | |
| WO | WO-2019233499 | A2 | * | 12/2019 | G01S 7/4813 |
| WO | WO-2021088831 | A1 | | 5/2021 | |

OTHER PUBLICATIONS

Pauliac, Romain. Windcube User's Manual. Nov. 2009. http://breeze.colorado.edu/ATOC6020/2018_Spring_files/WLS7_UserManual_01rev01.pdf.
PCT/CN2020/126268 International Search Report and Written Opinion (Translated) dated Jan. 27, 2021.

* cited by examiner

Temperature of a heat source/°C

Angle occupied by fins/°

Temperature of a heat source/°C

Fin intercept/mm

LIDAR

CROSS-REFERENCE TO RELATED APPLICATIONS

The present application is a continuation of International Patent Application No. PCT/CN2020/126268, filed Nov. 3, 2020, which claims priority to Chinese Patent Application No. 201911084356.7, entitled "LIDAR" filed with the China National Intellectual Property Administration on Nov. 7, 2019 and Chinese Patent Application No. 201911084362.2, entitled "A LIDAR" filed with the China National Intellectual Property Administration on Nov. 7, 2019, which are incorporated herein by reference in their entirety.

TECHNICAL FIELD

The present application relates to the laser emitter measurement field, and in particular, relates to a lidar.

BACKGROUND

This section provides background information related to the present application, and the information does not necessarily constitute the prior art.

A lidar housing is a closed structure, and components such as a laser emitter and a motor therein generate a large amount of heat during operation. Due to the closed structure of the lidar, it is difficult to dissipate the heat inside the lidar to the outside. If the lidar operates in a high temperature environment for a long time, the reliability of the lidar will be affected. Especially for the emitting chamber that houses the laser emitters, if the heat in the emitting chamber is not timely dissipated to the outside to lower the temperature in the emitting chamber, the lifetime of the laser emitter that emits the laser beam will be greatly shortened.

In the prior art, a heat sink is set in the lidar, and the heat is conducted into the heat sink through a circuit board of a lidar device, to control the internal temperature of the lidar.

SUMMARY

The present application provides a lidar, a first heat dissipation component is disposed on a first printed circuit board of an emitting chamber, and heat of the first printed circuit board is conducted to a chamber wall of the emitting chamber through the first heat dissipation component, so that a temperature of the first printed circuit board can be controlled, and the problem of the reliability of the lidar caused by overheating at localized areas of the first printed circuit board can be improved.

Embodiments of the present application provide a lidar, including an emitting chamber, where components disposed within the emitting chamber include at least one first printed circuit board and a film-shaped first heat dissipation component corresponding to the first printed circuit board, where a laser emitter is disposed on the first printed circuit board, and the first printed circuit board is configured to drive the laser emitter to emit a laser pulse; each first heat dissipation component includes a thermally conductive assembly portion and at least one heat dissipation assembly portion, and the thermally conductive assembly portion and the at least one heat dissipation assembly portion are not coplanar; the thermally conductive assembly portion is attached on a back face of the first printed circuit board corresponding to the thermally conductive assembly portion; and at least a portion of the at least one heat dissipation assembly portion is connected to a chamber wall forming the emitting chamber.

Optionally, the chamber wall forming the emitting chamber includes a central shaft portion of the lidar, a housing near a bottom of the emitting chamber, and an outer housing of the emitting chamber; the heat dissipation assembly portion includes a first heat dissipation assembly portion, a second heat dissipation assembly portion, and a third heat dissipation assembly portion, and the thermally conductive assembly portion is not coplanar with the first heat dissipation assembly portion, the second heat dissipation assembly portion, and the third heat dissipation assembly portion; the first heat dissipation assembly portion is connected to the housing near the bottom of the emitting chamber; the second heat dissipation assembly portion is connected to the central shaft portion of the lidar; and the third heat dissipation assembly portion is connected to the outer housing of the emitting chamber.

Optionally, the first heat dissipation assembly portion, the second heat dissipation assembly portion, and the third heat dissipation assembly portion are respectively connected to different side surfaces of the thermally conductive assembly portion.

Optionally, the first heat dissipation assembly portion has a preset angle with the thermally conductive assembly portion and is connected to a first side surface of the thermally conductive assembly portion, and the first heat dissipation assembly portion extends in a first direction from the back face of the first printed circuit board to a front face of the first printed circuit board, the first side surface is a side surface on which a first width side of the thermally conductive assembly portion is located, and the first width side is a side of the thermally conductive assembly portion near the bottom of the emitting chamber.

Optionally, the second heat dissipation assembly portion includes a first sub-assembly and a second sub-assembly that are mutually connected; the first sub-assembly has a first preset angle with the thermally conductive assembly portion, and the first sub-assembly is connected to a second side surface of the thermally conductive assembly portion; the first sub-assembly extends in a second direction from a front face of the first printed circuit board to the back face of the first printed circuit board; and the second sub-assembly has a second preset angle with the first sub-assembly, where the second side surface is a side surface on which a first long side of the thermally conductive assembly portion is located, and the second side surface is perpendicular to the first side surface; and at least a portion of the second sub-assembly is connected to the central shaft portion of the lidar.

Optionally, there are two or more first printed circuit boards, and the two or more first printed circuit boards are stacked on a same supporting component; and lengths of the first heat dissipation assembly portions of the first heat dissipation components corresponding to the first printed circuit boards are different from each other, the first heat dissipation assembly portions are stacked, and at least a portion of each first heat dissipation assembly portion is directly connected to the housing near the bottom of the emitting chamber.

Optionally, the third heat dissipation assembly portion includes a third sub-assembly and a fourth sub-assembly that are vertically connected; the third sub-assembly is connected to a fourth side surface of the thermally conductive assembly portion, and the fourth side surface is parallel to the first side surface; the third sub-assembly extends in a first direction from the back face of the first printed circuit board to a front face of the first printed circuit board, and the third sub-assembly is perpendicular to the thermally conductive assembly portion; the fourth sub-assembly is parallel to the thermally conductive assembly portion, and extends in a third direction from the fourth side surface to the first side surface; and at least a portion of the fourth sub-assembly is connected to the outer housing of the emitting chamber.

Optionally, a material of the first heat dissipation component is a film-shaped material of a high thermal conductivity, and the film-shaped material of a high thermal conductivity includes a graphite film and a copper film.

Optionally, the components disposed within the emitting chamber further include at least two second printed circuit boards and a second heat dissipation component; a power supply module for supplying power to the first printed circuit board is disposed on the second printed circuit board; and the second heat dissipation component is a thermally conductive gasket the thermally conductive gasket is disposed between two directly adjacent printed circuit boards and configured to conduct heat generated by the second printed circuit board, and is in contact with the heat dissipation structure.

Optionally, a material of the thermally conductive gasket is a material of a high thermal conductivity, and the material of a high thermal conductivity includes a graphite film and copper.

Optionally, the lidar includes a rotational structure for optics and mechanical parts, and the rotational structure for optics and mechanical parts includes a body, the emitting chamber, a receiving portion, and a set of fins, where a housing chamber is formed inside the body, the emitting chamber and the receiving portion are disposed within the housing chamber and are fixedly connected to the body of the rotational structure for optics and mechanical parts; and the set of fins is disposed on an outer side surface of a chamber body of the housing chamber and is fixedly connected to the body.

Optionally, a lens assembly component is disposed on the body, and the lens assembly component is configured to assemble an emitting lens and a receiving lens, where the set of fins is disposed on peripheral areas of the lens assembly component.

Optionally, the rotational structure for optics and mechanical parts includes a bottom surface, the set of fins includes an inclined fin, and a plane in which the inclined fin is located is not parallel to a plane in which the bottom surface is located.

Optionally, an angle between the plane in which the inclined fin is located and the plane in which the bottom surface is located has a correlation with a rotation speed of the lidar.

Optionally, the rotational structure for optics and mechanical parts includes a bottom surface, the set of fins includes a lateral fin, and a plane in which the lateral fin is located is parallel to a plane in which the bottom surface is located.

Optionally, the body and the set of fins are integrally formed.

Optionally, the set of fins includes at least one subset of fins, fins in each subset of fins are fixedly connected to a plate corresponding to the subset of fins, and the plate is fixedly connected to the body.

Optionally, an angle between a rotating shaft of the lidar and outermost two sides of the set of fins correlates to a ratio of the emitting portion and the receiving portion occupying the housing chamber.

Optionally, the angle between the rotating shaft of the lidar and the outermost two sides of the set of fins is greater than 90 degrees and less than 300 degrees.

Optionally, a spacing between fins in the set of fins is greater than or equal to 4 millimeters and less than or equal to 15 millimeters.

A lidar provided in the embodiments of the present application includes an emitting chamber and a heat dissipation structure disposed around the emitting chamber. The emitting chamber includes at least one first printed circuit board, at least one second printed circuit board, at least one film-shaped first heat dissipation component, and at least one second heat dissipation component. The first heat dissipation component includes a thermally conductive assembly and at least one heat dissipation assembly connected to the thermally conductive assembly, and the thermally conductive assembly is attached on a back face of the first printed circuit board. For each heat dissipation assembly, at least part of the heat dissipation assembly is perpendicular to the thermally conductive assembly, and at least part of the heat dissipation assembly is in contact with the heat dissipation structure. Therefore, the heat in the emitting chamber can be quickly conducted out of the emitting chamber, to quickly control the temperature in the emitting chamber, thereby resolving the problem of the reliability of the lidar caused by overheating at localized areas of the first printed circuit board In some optional implementations, a set of fins is disposed outside a housing chamber of a lidar, a rotational structure for optics and mechanical parts may drive the set of fins to rotate, the rotation of the set of fins may produce a certain disturbance to the air between the rotational structure for optics and mechanical parts and an outer housing of the lidar, so that a convective heat transfer coefficient between the air and a solid wall (the rotational structure for optics and mechanical parts and the outer housing) is increased, and the thermal resistance between the rotational structure for optics and mechanical parts and the outer housing is reduced. Therefore, a rate of transferring the heat generated by the rotational structure for optics and mechanical parts outside the lidar can be accelerated, and the reliability of the lidar can be further improved.

BRIEF DESCRIPTION OF THE DRAWINGS

Other features, objectives, and advantages of the present application become more obvious by reading the detailed description of non-limiting embodiments that is provided with reference to the following accompanying drawings.

In the drawings.

1—Body; 2—Set of fins, 21—First subset of fins, 22—Second subset of fins, 23—Third subset of fins, 24—First plate, 25—Second plate; 3—Lens assembly component; 4—Bottom surface; 5—Top surface; 6—Emitting lens; 7—Receiving lens; 8—Emitting chamber; 9—Receiving portion.

DETAILED DESCRIPTION

The present application is further described in detail below with reference to the accompanying drawings and embodiments. It may be understood that specific embodiments described herein are only used to explain a related invention, but not to limit the invention. In addition, it should be further noted that, for convenience of description, only those parts relevant to the related invention are shown in the accompanying drawings.

It should be noted that, the embodiments in the present application and features in the embodiments may be combined with each other in the case of no conflict. The present application is described in detail below with reference to the accompanying drawings and the embodiments.

In the present application, a lidar may be a mechanical lidar or a solid-state lidar. The mechanical lidar is used as an example for description below.

Figure 1:
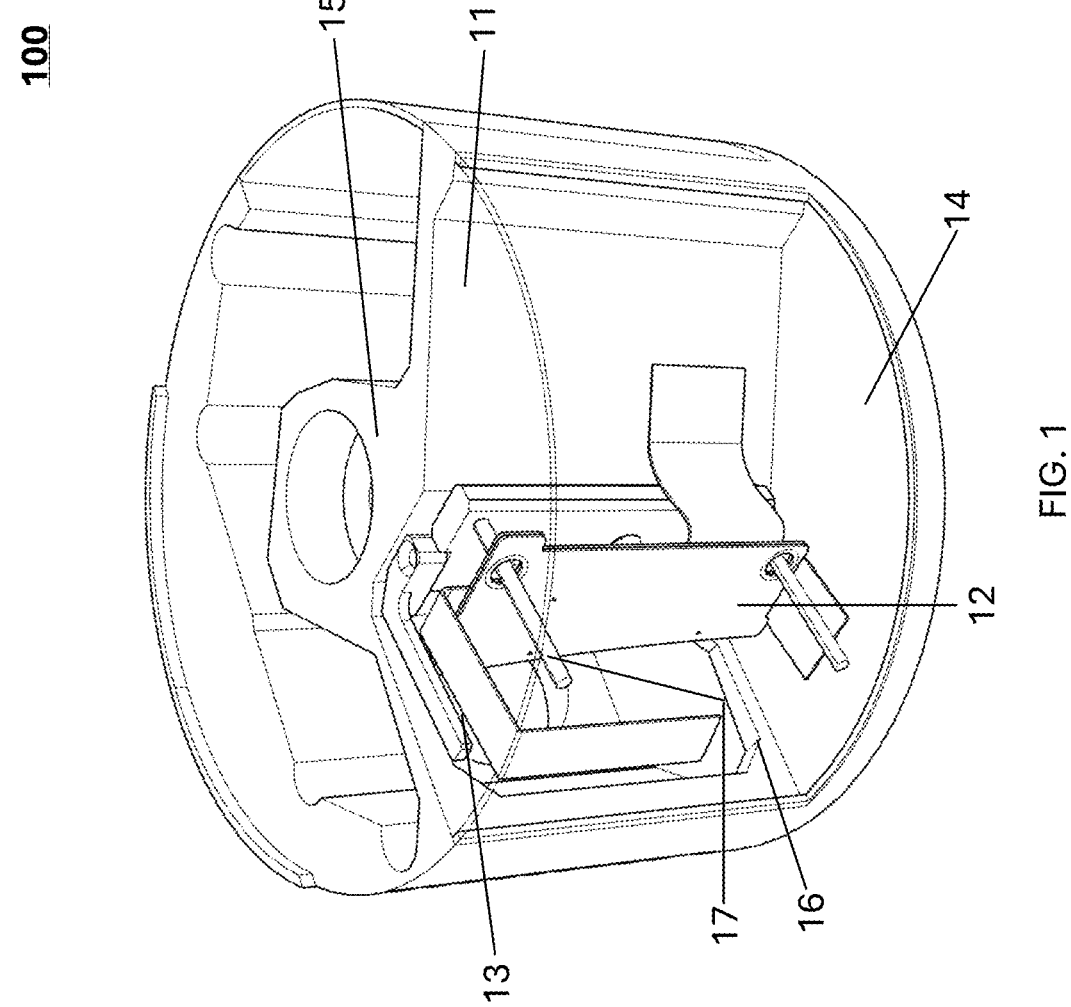
FIG. 1 is a schematic structural diagram of a lidar according to an embodiment of the present application.

FIG. 1 is a schematic structural diagram of a lidar according to an embodiment of the present application.

As shown in FIG. 1, a lidar 100 includes an emitting chamber 11. Components disposed within the emitting chamber 11 include at least one first printed circuit board 12 and a film-shaped first heat dissipation component 13 corresponding to the first printed circuit board 12. Laser emitters (not shown) are disposed on the first printed circuit board 12. The first printed circuit board 12 is configured to drive the laser emitter to emit a laser pulse.

One or two or more first printed circuit boards 12 may be included.

The laser emitter is a device that emits the laser pulse. The laser emitter generates a large amount of heat during operation. A threshold current of the laser emitter increases as a temperature of the laser emitter increases, and the increase in the threshold current further causes the laser emitter to generate more heat. In addition, when the laser emitter operates at a high temperature, a wavelength of an emitted laser changes, resulting in the degradation of laser emitter performance. The lifetime of the laser emitter is also affected if the laser emitter operates in a high temperature environment for a long time.

As far as the inventors know, only the first printed circuit board for setting the laser emitter is currently used to conduct heat to a heat dissipation structure. The heat transmission path is relatively singular, which may easily cause temperature at localized areas to be excessively high and cause device damage.

In order to increase a heat transmission channel on the first printed circuit board 12 and prevent high temperature at localized areas of the first printed circuit board 12 that affects the lifetime of the lidar, the film-shaped first heat dissipation component 13 is used in this embodiment of the present application. Specifically, a first heat dissipation component 13 that is in one-to-one correspondence with each first printed circuit board 12 is disposed.

Each first heat dissipation component 13 includes a thermally conductive assembly portion and at least one heat dissipation assembly portion. One or two or more heat dissipation assembly portions may be included. The thermally conductive assembly portion of each first heat dissipation component 13 and at least one heat dissipation assembly portion of the first heat dissipation component may be not coplanar. The thermally conductive assembly portion of each first heat dissipation component and at least one heat dissipation assembly portion may be integrally formed.

The first printed circuit board 12 may include two surfaces, where a surface from which a laser emitter device protrudes is regarded as a front face of the first printed circuit board 12, and a surface of the first printed circuit board 12 opposite to the front face is regarded as a back face of the first printed circuit board 12.

The first printed circuit board 12 may have a quasi-cuboid shape. The thermally conductive assembly portion may also have a quasi-cuboid shape. A size of the thermally conductive assembly portion may be the same as a size of the first printed circuit board 12. A surface of the thermally conductive assembly portion may be a horizontal plane. The thermally conductive assembly portion may be attached on the back face of the first printed circuit board. In an implementation, the thermally conductive assembly portion may be attached in parallel with the back face of the first printed circuit board 12. During attachment, an adhesive of a relatively high thermal conductivity may be disposed between the thermally conductive assembly portion and the first printed circuit board 12.

That is, the thermally conductive assembly portion of each first heat dissipation component 13 may be attached on the back face of the first printed circuit board 12 corresponding to the first heat dissipation component 13. At least a portion of at least one heat dissipation assembly portion of the first heat dissipation component 13 is connected to a chamber wall forming the emitting chamber 11.

A material of the first heat dissipation component 13 may have a very high thermal conductivity, such as a graphite film or copper. In certain application scenarios, a material of the first heat dissipation component 13 may be a graphite film. The graphite film is flexible and easy to assemble.

The chamber wall forming the emitting chamber 11 may include a central shaft portion 15 of the lidar 100, a housing 14 near the bottom of the emitting chamber, and an outer housing 16 of the emitting chamber. Generally, the central shaft portion 15 of the lidar, the housing 14 near the bottom of the emitting chamber, and the outer housing 16 of the emitting chamber have a lower temperature than a temperature inside the emitting chamber 11 or are relatively easier to dissipate heat or at least not sources of heat. The central shaft portion 15 of the lidar, the housing 14 near the bottom of the emitting chamber 11, and the outer housing 16 of the emitting chamber may be formed by an integral molding process.

In certain application scenarios, the housing 14 near the bottom of the emitting chamber 11 may be connected to a heat sink, or may be provided with a heat sink for heat dissipation.

The thermally conductive assembly portion is attached in parallel with the first printed circuit board 12. Therefore, if any position on the first printed circuit board 12 is in a high temperature state, heat at the position may be conducted to the thermally conductive assembly portion, and then conducted to the chamber wall of the emitting chamber through at least one heat dissipation assembly portion. In this way, a phenomenon that temperature at localized areas of the first printed circuit board 12 is excessively high due to a heat dissipation method that only the first printed circuit board 12 conducts heat to the chamber wall forming the emitting chamber can be avoided, so that the lifetime of the lidar may be prolonged.

Figure 2:
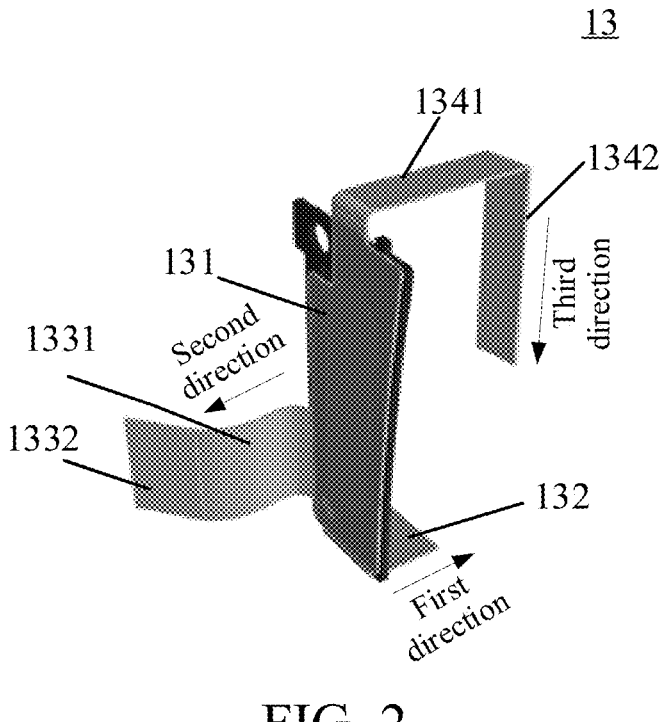
FIG. 2 is a schematic structural diagram of a first heat dissipation component according to an embodiment of the present application.

FIG. 2 is a schematic structural diagram of a first heat dissipation component according to an embodiment of the present application. As shown in FIG. 2, the first heat dissipation component 13 may include a thermally conductive assembly portion 131, a first heat dissipation assembly portion 132, a second heat dissipation assembly portion (1331 and 1332), and a third heat dissipation assembly portion (1341 and 1342). The thermally conductive assembly portion 131 may be not coplanar with the first heat dissipation assembly portion 132, the second heat dissipation assembly portion, and the third heat dissipation assembly portion. The first heat dissipation assembly portion 132 may be connected to the housing 14 near the bottom of the emitting chamber. The second heat dissipation assembly portion (1331 and 1332) may be connected to or attached to the central shaft portion 15 of the lidar. At least a portion of the third heat dissipation assembly portion (1341 and 1342) may be connected to the outer housing 16 of the emitting chamber. The outer housing 16 of the emitting chamber may include an inner surface and an outer surface. The third heat dissipation assembly portion (1341 and 1342) may be connected to the inner surface of the outer housing 16 of the emitting chamber, or may be connected to the outer surface of the outer housing 16 of the emitting chamber. When the third heat dissipation assembly portion is connected to the outer surface of the outer housing 16 of the emitting chamber, the heat dissipation effect of the third heat dissipation assembly portion is better.

In certain application scenarios, the first heat dissipation assembly portion 132, the second heat dissipation assembly portion (1331 and 1332), and the third heat dissipation assembly portion (1341 and 1342) are respectively connected to different side surfaces of the thermally conductive assembly portion 131.

In these application scenarios, each heat dissipation assembly portion may protrude from one side surface of the thermally conductive assembly portion, and at least part of the heat dissipation assembly portion is perpendicular to the thermally conductive assembly portion. Because different heat dissipation assembly portions protrude from different side surfaces of the thermally conductive assembly portion, and each heat dissipation assembly portion is connected to the chamber wall of the emitting chamber, it is beneficial to conduct the heat on the first printed circuit board to the surrounding more uniformly and avoid overheating at localized areas.

The first heat dissipation assembly portion 132 may be perpendicular to the thermally conductive assembly portion 131 and connected to a first side surface of the thermally conductive assembly portion 131. The first heat dissipation assembly portion 132 extends in a first direction from the back face of the first printed circuit board 12 to the front face of the first printed circuit board 12. The first side surface may be a side surface on which a first width side of the thermally conductive assembly portion is located. The first width side may be a side of the thermally conductive assembly portion near the bottom of the emitting chamber.

In these application scenarios, the first heat dissipation assembly portion 132 may conduct the heat on the thermally conductive assembly portion 131 to the housing 14 near the bottom of the emitting chamber, and control the temperature of the first printed circuit board 12 by lowering the temperature of the thermally conductive assembly portion 131.

The second heat dissipation assembly portion may include a first sub-assembly 1331 and a second sub-assembly 1332 that are mutually connected.

The first sub-assembly 1331 has a first preset angle with the thermally conductive assembly portion 131, and the first sub-assembly 1331 is connected to a second side surface of the thermally conductive assembly portion 131. The first sub-assembly 1331 may extend in a second direction from the front face of the first printed circuit board 12 to the back face of the first printed circuit board 12. The second sub-assembly 1332 has a second preset angle with the first sub-assembly 1331. The second side surface is a side surface on which a first long side of the thermally conductive assembly portion is located, and the second side surface is perpendicular to the first side surface.

At least a portion of the second sub-assembly 1332 is connected to or attached to the central shaft portion 15 of the lidar. For example, the second sub-assembly 1332 of each second heat dissipation assembly portion may be connected to or attached to the central shaft portion 15 of the lidar.

The first preset angle and the second preset angle herein may be any angles set for the convenience of attaching the second sub-assembly 1332 and the central shaft portion 15 of the lidar. The first preset angle and the second preset angle may be set according to specific application scenarios, which are not limited herein. In certain application scenarios, the first preset angle and the second preset angle may be right angles.

Further, at least a portion of the second sub-assembly 1332 is directly connected to the central shaft portion 15 of the lidar. A direct connection herein means that only an adhesive material is used between a part of the second sub-assembly 1332 and the central shaft portion 15 of the lidar. In an implementation, the central shaft portion 15 of the lidar connected to the second sub-assembly 1332 may be used to isolate the emitting chamber and a receiving chamber of the lidar. The second sub-assembly is directly connected to the central shaft portion of the lidar herein, so that the heat on the thermally conductive assembly portion can be conducted to the central shaft portion of the lidar through the second sub-assembly, so as to alleviate high temperature at localized areas phenomenon of the first printed circuit board.

For a multi-line lidar, two or more first printed circuit boards 12 may be included. Each first printed circuit board 12 may correspond to one first heat dissipation component 13. Different first printed circuit boards 12 may be stacked on the same supporting component 17. The first heat dissipation components 13 respectively corresponding to the different first printed circuit boards 12 may be partially stacked. For example, the third heat dissipation assembly portions respectively corresponding to the different first printed circuit boards 12 may be stacked. In certain application scenarios, the first heat dissipation assembly portions respectively corresponding to the different first printed circuit boards 12 may also be stacked.

In certain application scenarios, lengths of the first heat dissipation assembly portions 132 respectively corresponding to each of the first printed circuit boards 12 are different from each other, the first heat dissipation assembly portions 132 are stacked, and at least a portion of each first heat dissipation assembly portion 132 is directly connected to and in contact with the housing 14 near the bottom of the emitting chamber of the lidar. In these application scenarios, at least a portion of each first heat dissipation assembly portion 132 may be directly connected to the housing 14 near the bottom of the emitting chamber of the lidar for better heat dissipation.

Figure 3:
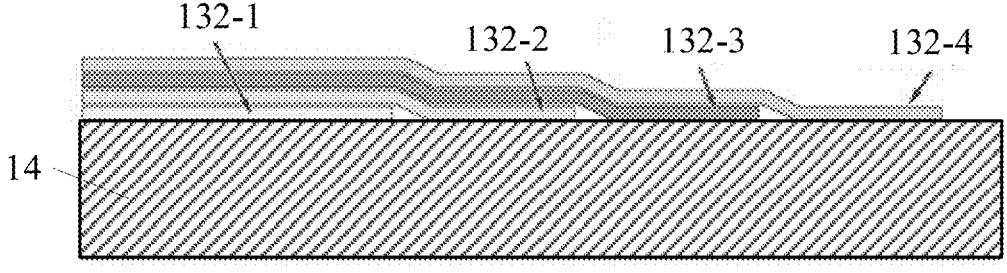
FIG. 3 is a schematic diagram showing position arrangements between first heat dissipation assembly portions respectively corresponding to a plurality of first heat dissipation components.

FIG. 3 is a schematic diagram showing position arrangements of first heat dissipation assembly portions respectively corresponding to different first printed circuit boards. As shown in FIG. 3, a first heat dissipation assembly portion 132-1 of a first printed circuit board, a first heat dissipation assembly portion 132-2 of a second first printed circuit board, a first heat dissipation assembly portion 132-3 of a third first printed circuit board, and a first heat dissipation assembly portion 132-4 of a fourth first printed circuit board are stacked.

The first heat dissipation assembly portion 132-1 of the first printed circuit board has the shortest length, and 132-1 may be directly connected to the housing 14 near the bottom of the emitting chamber. A length of the first heat dissipation assembly portion 132-2 of the second first printed circuit board is longer than that of 132-1. A portion of 132-2 that is longer than 132-1 may be directly connected to the housing 14 near the bottom of the emitting chamber. A length of the first heat dissipation assembly portion 132-3 of the third first printed circuit board is longer than that of 132-2. A portion of 132-3 that is longer than 132-2 may be directly connected to the housing 14 near the bottom of the emitting chamber. A length of the first heat dissipation assembly portion 132-4 of the fourth first printed circuit board is longer than that of 132-3. A portion of 132-4 that is longer than 132-3 may be directly connected to the housing 14 near the bottom of the emitting chamber of the lidar. The first printed circuit board 12 herein may be a first printed circuit board closest to the central shaft portion of the lidar. The second first printed circuit board 12 may be a first printed circuit board closest to the first printed circuit board. The third first printed circuit board 12 may be a first printed circuit board closest to the second first printed circuit board other than the second first printed circuit board. Arrangements of other first printed circuit boards may be similarly made.

In this way, the first heat dissipation assembly portions in the emitting chamber may be directly connected to the housing near the bottom of the emitting chamber of the lidar, which is beneficial to conduct the heat on the first heat dissipation assembly portion to the heat sink at the bottom of the lidar in time, to control the temperature of the first printed circuit board in the emitting chamber.

The third heat dissipation assembly portion includes a third sub-assembly 1341 and a fourth sub-assembly 1342 that are vertically connected. The third sub-assembly may be connected to a third side surface of the thermally conductive assembly portion 131. The third side surface may be parallel to the first side surface. The third sub-assembly 1341 may extend in the first direction. The third sub-assembly 1341 may be perpendicular to the thermally conductive assembly portion 131. The fourth sub-assembly 1342 may be parallel to the thermally conductive assembly portion 131, and extend in a third direction from the third side surface to the first side surface. At least a portion of the fourth sub-assembly 1342 is at least partially connected to the housing 16 of the emitting chamber.

In these application scenarios, the fourth sub-assembly 1342 is connected to a chamber body 15 of the emitting chamber near a central shaft, the heat on the thermally conductive assembly portion may be conducted to the central shaft of the emitting chamber through the fourth sub-assembly 1342, to alleviate high temperature at localized areas of the first printed circuit board 12.

It should be noted that, the second heat dissipation assembly portion and the third heat dissipation assembly portion of the first heat dissipation component of the different first printed circuit boards may also have the position arrangements similar to that shown in FIG. 3, and details are not described herein.

The heat on the thermally conductive assembly portion may be conducted to different directions by using a plurality of heat dissipation assembly portions connected to different side surfaces of the thermally conductive assembly portion. In an aspect, a rate of heat conduction can be accelerated, and in another aspect, the heat conduction can be more uniform, so that the temperature of the first printed circuit board in the emitting chamber can be effectively controlled.

Figure 4:
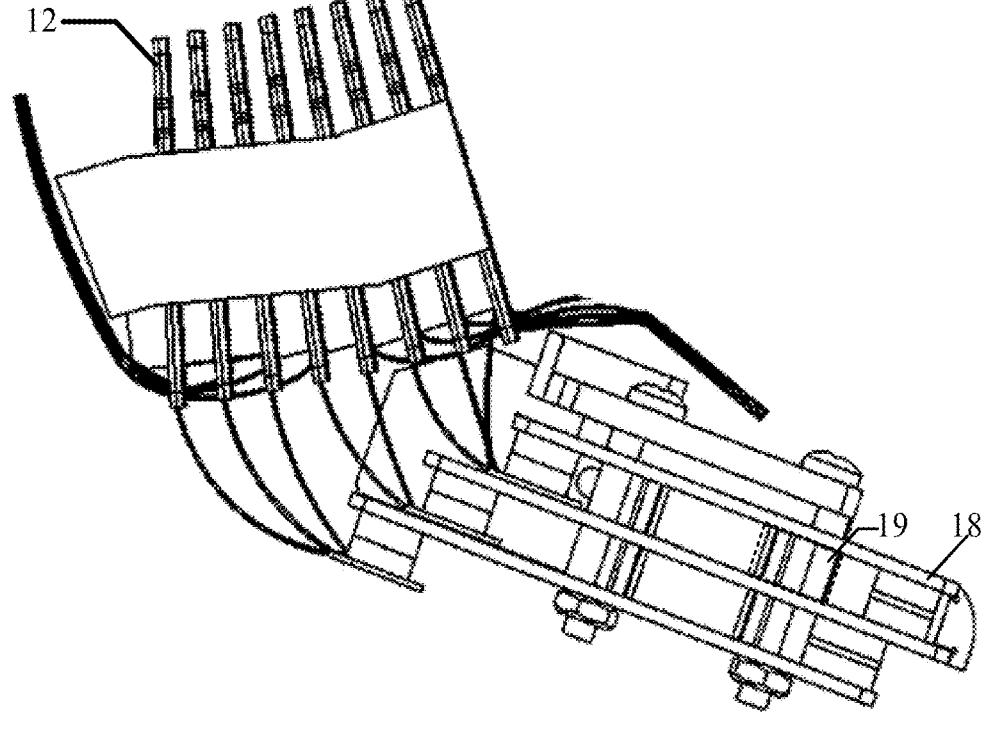
FIG. 4 is a schematic structural diagram of components in an emitting chamber according to an embodiment of the present application.

FIG. 4 is a schematic structural diagram of components in an emitting chamber. As shown in FIG. 4, in addition to the first printed circuit board 12, the emitting chamber further includes at least two second printed circuit boards 18 and a second heat dissipation component 19. A power supply module for supplying power to the first printed circuit board 12 is disposed on the second printed circuit board 18.

The second heat dissipation component 19 may be a thermally conductive gasket. The thermally conductive gasket 19 may be disposed between two directly adjacent second printed circuit boards 18. In certain application scenarios, the second heat dissipation component 19 may have a columnar shape.

A material of the thermally conductive gasket 19 may be a material have of a high thermal conductivity such as a graphite film or copper.

The second heat dissipation component 19 is configured to conduct heat generated by the second printed circuit board 18. The second heat dissipation component 19 may be connected to the chamber wall of the emitting chamber.

In certain application scenarios, two or more second printed circuit boards 18 may be disposed in the lidar. In these application scenarios, each second heat dissipation component 19 may be disposed between two adjacent second printed circuit boards 18. One second heat dissipation component 19 may be disposed between every two adjacent second printed circuit boards 18.

In this way, the heat on the second printed circuit board may be conducted to the chamber wall of the emitting chamber in time by disposing the second heat dissipation component configured to conduct the heat on the second printed circuit board, so that high temperature or overheating at localized areas of the second printed circuit board can be avoided.

In this embodiment, by disposing the first heat dissipation component on the first printed circuit board of the emitting chamber, and disposing the second heat dissipation component on the second printed circuit board, the heat generated by the first printed circuit board and the second printed circuit board is conducted to a heat dissipation structure through the dissipation components. The heat in the emitting chamber can be quickly conducted to the chamber wall of the emitting chamber, and a heat sink may be disposed outside the chamber wall of the emitting chamber, so as to achieve the purpose of quickly controlling the internal temperature of the emitting chamber.

Figure 5:
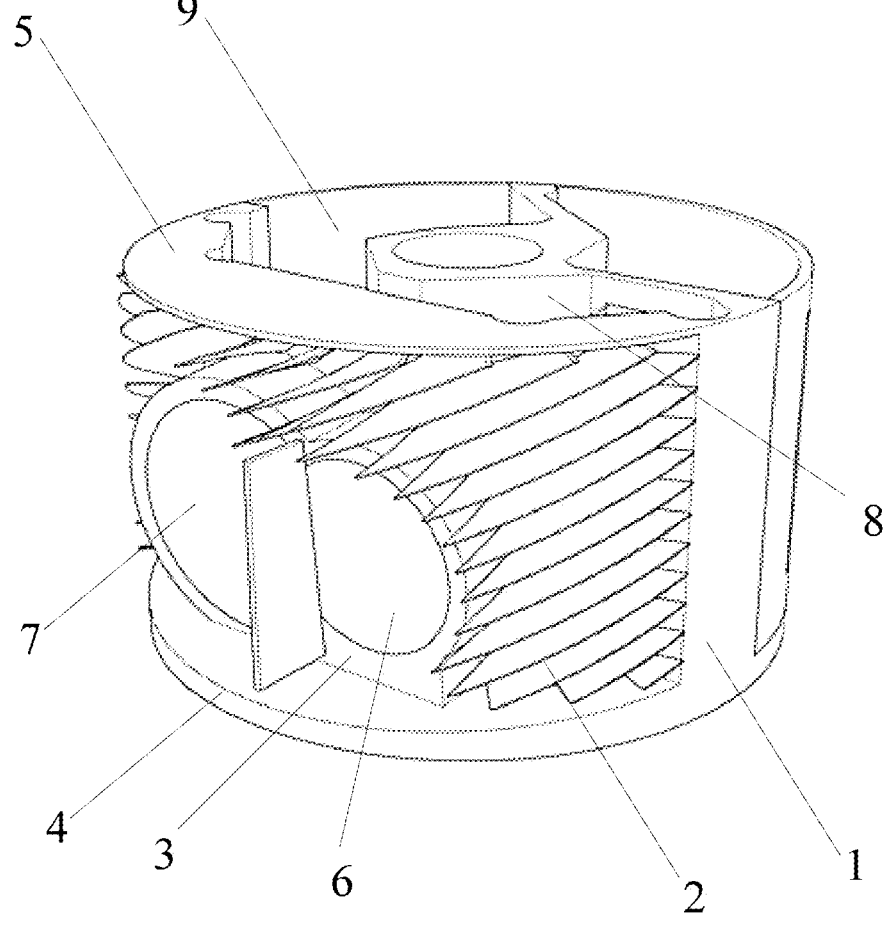
FIG. 5 is a schematic structural diagram of a lidar according to another embodiment of the present application.

In certain application scenarios, the lidar may be a mechanical lidar. FIG. 5 shows a lidar according to another embodiment of the present application, including a rotational structure for optics and mechanical parts, where the rotational structure for optics and mechanical parts includes a body 1, an emitting chamber 8, a receiving portion 9, and a set of fins 2.

In this embodiment, a housing chamber may be formed inside the body. The emitting portion and the receiving portion are disposed within the housing chamber and are integrally formed with the body.

In this embodiment, the rotational structure for optics and mechanical parts may be of any shape, for example, cylinder, sphere, pyramid, etc. A center of the body of the rotational structure for optics and mechanical parts is a hollow structure. A rotating shaft of the lidar is assembled in the hollow structure, and the emitting portion is carried in the emitting chamber and the receiving portion is accommodated in a receiving chamber. When the body of the rotational structure for optics and mechanical parts is driven to rotate by the rotating shaft, the emitting portion and the receiving portion remain stationary relative to the body, and can rotate with the body. Generally, an outer housing may be disposed outside the rotational structure for optics and mechanical parts.

In this embodiment, the set of fins 2 is disposed on an outer side surface of a chamber body of the housing chamber and is fixedly connected to the body 1. It may be understood that the housing chamber may include a housing chamber wall, and the set of fins may be disposed on an outer side surface of the housing chamber wall (on a side surface).

It should be noted that, the rotational structure for optics and mechanical parts and the outer housing of the lidar are usually not in contact, so that heat dissipation between the rotational structure for optics and mechanical parts and the outer housing can only depend on air circulation. In this case, thermal resistance between the rotational structure for optics and mechanical parts and the outer housing may be relatively large.

In the lidar provided in this embodiment, by disposing the set of fins on the outer side of the housing chamber, the rotational structure for optics and mechanical parts can drive the set of fins to rotate, the rotation of the set of fins can produce a certain disturbance to the air between the rotational structure for optics and mechanical parts and the outer housing of the lidar, thereby increasing the convective heat transfer coefficient between the air and a solid wall (the rotational structure for optics and mechanical parts and the outer housing), reducing the thermal resistance between the rotational structure for optics and mechanical parts and the outer housing.

It should be noted that, the fixed connection involved in the present application may be implemented by any appropriate manner such as welding, gluing, and screw connection, which is not limited herein.

In this embodiment, a specific position of the set of fins on the outer side surface of the chamber body is not limited.

In this embodiment, a material of the set of fins may be selected according to actual conditions, which is not limited herein. In an example, the set of fins may be made of a metal material of a good thermal conductivity.

In some embodiments, a lens assembly component 3 is disposed on the body 1. An emitting lens 6 and a receiving lens 7 may be assembled on the body 1 by the lens assembly component herein. The receiving lens may be disposed in the receiving portion. The emitting lens may be disposed in the emitting portion.

In some embodiments, referring to FIG. 5, the set of fins 2 may be disposed on peripheral areas of the lens assembly component 3 and is fixedly connected to the body 1.

It should be noted that, a space between the lens assembly component and the body of the rotational structure for optics and mechanical parts may be fully utilized by disposing the set of fins on the peripheral areas of the lens assembly component 3, so that various structures of the rotational structure for optics and mechanical parts with the set of fins mounted can be appropriately arranged, reducing the volume of the rotational structure for optics and mechanical parts.

In some embodiments, the rotational structure for optics and mechanical parts may include an inner cylinder and an outer cylinder, and a housing chamber is formed between the inner cylinder and the outer cylinder. The lens assembly component may be disposed on a cylinder wall of the outer cylinder. It should be noted that, the inner cylinder and the outer cylinder may be cylindrical or irregular shape.

Optionally, if the rotational structure for optics and mechanical parts is a cylinder, a lens may be disposed on a side surface of the body of the rotational structure for optics and mechanical parts. Therefore, the lens assembly component may also be disposed on the side surface of the body of the rotational structure for optics and mechanical parts. Correspondingly, the set of fins may be also disposed on an outer side surface of the side surface of the body.

In some embodiments, the rotational structure for optics and mechanical parts includes a bottom surface 4. Generally, the rotational structure for optics and mechanical parts may also include a top surface 5. The bottom surface is generally parallel to the top surface.

In some embodiments, the set of fins may be disposed as relatively inclined fins. Referring to FIG. 5, the fins shown in FIG. 5 may be understood as inclined fins. The inclination herein means that a plane in which the inclined fin is located is not parallel to a plane in which the bottom surface is located. It may be understood that the plane in which the inclined fin is located is not parallel to a plane in which the top surface is located.

In some embodiments, an inclination angle of the inclined fin may be set according to actual conditions, which is not limited herein. The inclination angle may be an angle between the plane in which the inclined fin is located and the plane in which the bottom surface is located.

In some embodiments, the angle between the plane in which the inclined fin is located and the plane in which the bottom surface is located has a correlation with a rotation speed of the lidar.

Optionally, the inclination angle may be proportional to the rotation speed of the lidar. Therefore, during the rotation of the rotational structure for optics and mechanical parts, the set of fins drives a small whirlwind for heat dissipation, and the small whirlwind is ensured to be the largest.

In some embodiments, the angle between the plane in which the inclined fin is located and the plane in which the bottom surface is located may be set to about 45 degrees. It may be understood that if certain deviations from 45 degrees are within a preset threshold range, such as within a range of ±15 degrees, such an inclination angle may also be considered as 45 degrees.

Figure 6:
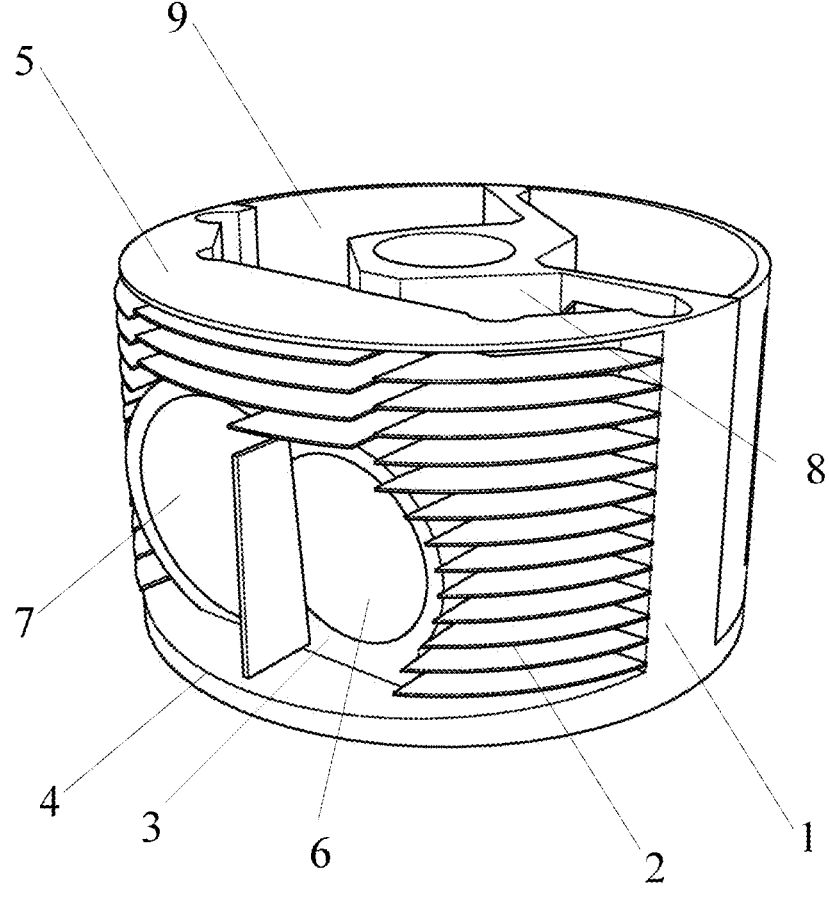
FIG. 6 is a schematic structural diagram of a lateral fin according to the present application.

In some embodiments, the set of fins includes a lateral fin. A plane in which the lateral fin is located is parallel to the plane in which the bottom surface is located. FIG. 6 is a schematic diagram of a lidar with lateral fins. It may be understood that the plane in which the lateral fin is located is parallel to the plane in which the top surface is located. It should be noted that, the parallel may be substantially parallel, that is, if an angle is less than a preset angle threshold, such as ±10 degrees, it can also be considered as parallel.

It should be noted that, compared with the lateral fin, the inclined fin can cause greater disturbance to the air and enhance the heat dissipation between the air and the solid wall.

In some embodiments, the set of fins may include the inclined fin and the lateral fin.

In some embodiments, a quantity of fins in the set of fins may be set according to actual conditions, which is not limited herein.

In some embodiments, the body of the rotational structure for optics and mechanical parts may be integrally formed with the set of fins. In other words, when the body of the rotational structure for optics and mechanical parts is fabricated, the set of fins can be fabricated with the body.

It should be noted that, the set of fins and the rotational structure for optics and mechanical parts are integrally formed, which can save the time of assembling the set of fins and improve the assembly efficiency.

In some embodiments, the set of fins may include at least one subset of fins. Fins in the subset of fins herein are fixedly connected to a plate corresponding to the subset of fins, and the plate is fixedly connected to the body.

Figure 7:
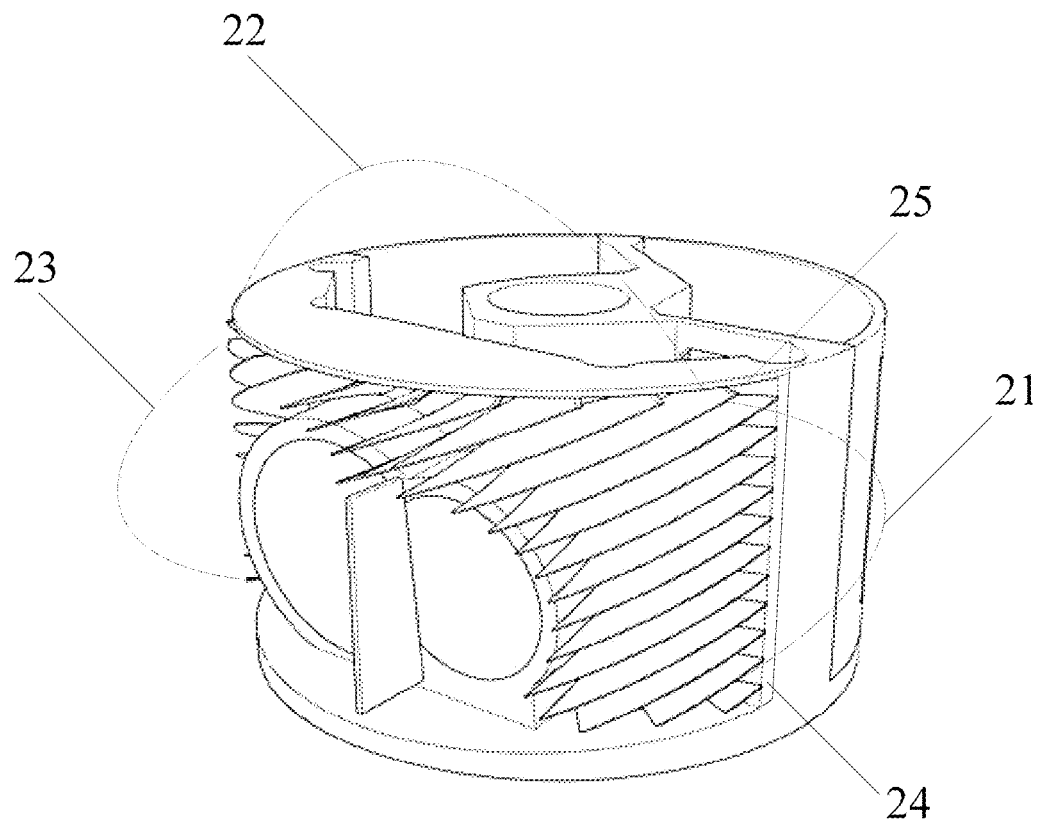
FIG. 7 is a schematic diagram in which a set of fins is divided into subsets of fins according to the present application.

In some embodiments, the set of fins may be divided into two subsets of fins according to a mounting direction. FIG. 7 shows a first subset of fins 21 and a second subset of fins 22. Two ends of a dotted line indicated by the reference numeral 21 indicate two fins, and the two fins and fins between the two fins can be regarded as the first subset of fins 21. Two ends of a dotted line indicated by the reference numeral 22 indicate two fins, and the two fins and fins between the two fins can be regarded as the second subset of fins 22. The first subset of fins 21 may correspond to a first plate 24, and the first plate may be connected to a surface in a vertical direction of the body. The second subset of fins 22 may correspond to a second plate 25, and the second plate 25 may be connected to the top surface of the body.

In some embodiments, the set of fins may further include a third subset of fins 23. Two ends of a dotted line indicated by the reference numeral 23 indicate two fins, and the two fins and fins between the two fins can be regarded as the third subset of fins 23. If a separating plane between the emitting lens and the receiving lens is taken as a plane of symmetry, the third subset of fins may be symmetrical with the first subset of fins. A third plate corresponding to the third subset of fins may be symmetrical with the first plate.

It should be noted that, as the subset of fins is disposed, the subset of fins corresponds to the plate, and the plate is fixedly connected to the body. In this manner, because the manufacturing process of the subset of fins and the plate is simple, and the assembly of the plate and the body is convenient, the mounting difficulty of the set of fins can be reduced, and the manufacturing difficulty of the rotational structure for optics and mechanical parts can be reduced.

In some embodiments, an angle between a rotating shaft of the lidar and outermost two sides of the set of fins correlates to a ratio of the emitting portion and the receiving portion occupying the housing chamber.

It may be understood that, in specific product design requirements, a space ratio of the emitting portion and the receiving portion in the housing chamber is specified. Therefore, the angle between the rotating shaft of the lidar and the outermost two sides of the set of fins (that is, an angle between lines connecting the outermost two sides of the set of fins and the shaft center) may be limited.

Figure 8:
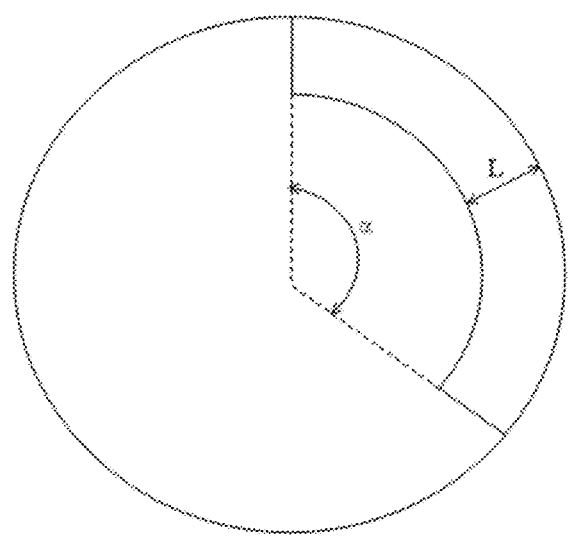
FIG. 8 is a schematic cross-sectional view (which is perpendicular to a rotating shaft) of a rotational structure for optics and mechanical parts.

The angle between the rotating shaft of the lidar and the outermost two sides of the set of fins may be referred to as a set of fins angle herein. FIG. 8 shows a set of fins angle α. FIG. 8 may be a schematic cross-sectional view (which is perpendicular to a rotating shaft) of a rotational structure for optics and mechanical parts. The set of fins angle may be an angle α formed between lines connecting a central shaft projection point (a center of a circle) and projection points of end surfaces of the two set of fins. The central shaft projection point represents a projected point of a central shaft of the rotor on the plane in which the bottom surface is located, and the projection point of the end surface of the set of fins represents a projected point of the end surface of the set of fins on the plane in which the bottom surface is located.

In some embodiments, a value of the set of fins angle may be set according to actual conditions, which is not limited herein.

Figure 9:
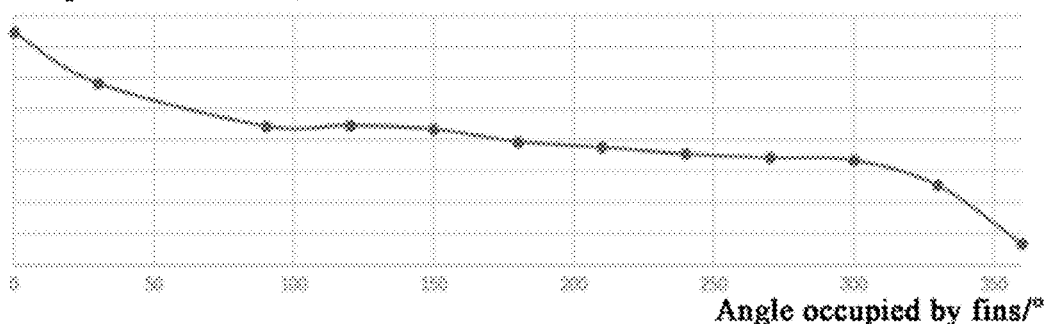
FIG. 9 is a schematic diagram of a relationship between a set of fins angle and a temperature of a heat source.

FIG. 9 is a relationship between a set of fins angle and a temperature of a heat source. In FIG. 9, a horizontal coordinate represents the set of fins angle, the set of fins angle may also be an angle of fins, and the unit of the horizontal coordinate may be "degree (°)". A vertical coordinate represents a temperature of a heat source (such as an emitting end of a lidar), and the unit of the vertical coordinate may be degrees Celsius (° C.). It may be understood that a rectangular box drawn in FIG. 9 may facilitate the comparison and display of a change trend. It should be noted that, FIG. 9 is mainly to show the change trend of the temperature of the heat source with the change of the set of fins angle. The trend has weak correlation with a specific value of the horizontal coordinate. Therefore, the specific value of the horizontal coordinate is not marked.

The heat source herein may be any specified device, which is not limited herein. In an example, the heat source may be a laser emitter, a laser emitting board where the laser emitter is located, or the like.

In some embodiments, the angle (that is, the set of fins angle) may be greater than 90 degrees and less than 300 degrees. It should be noted that, the set of fins angle that is greater than 90 degrees and less than 300 degrees can ensure the heat dissipation efficiency, and can provide as large a housing chamber space as possible for the emitting portion and the receiving portion.

In some embodiments, a spacing between fins in the set of fins may be set according to actual conditions, which is not limited herein.

Figure 10:
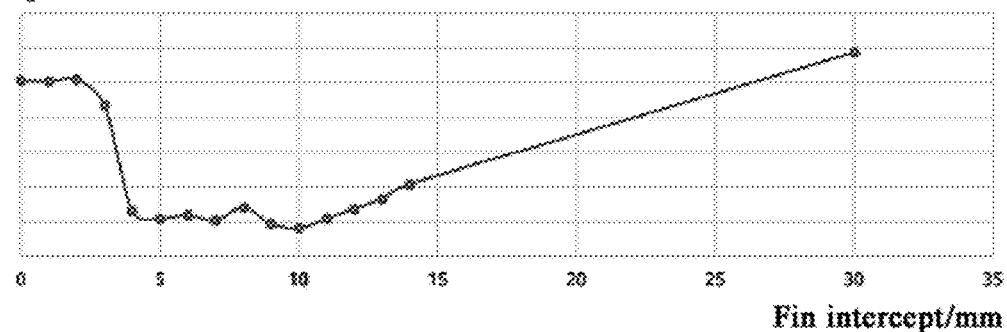
FIG. 10 is a schematic diagram of a relationship between a fin spacing and a temperature of a heat source.

FIG. 10 is a relationship between a fin spacing (which may be also referred to as a fin intercept) and a temperature of a heat source. In FIG. 10, a horizontal coordinate may represent the fin intercept, and the unit of the horizontal coordinate may be millimeters. A vertical coordinate represents a temperature of a heat source, and the unit of the vertical coordinate may be degrees Celsius (° C.). It may be understood that a rectangular box drawn in FIG. 10 may facilitate the comparison and display of a change trend. It should be noted that, FIG. 10 is mainly to show a change trend of the temperature of the heat source with the change of the fin intercept, which has weak correlation with a specific value of the horizontal coordinate. Therefore, the specific value of the horizontal coordinate is not marked.

In some embodiments, the spacing between fins in the set of fins may be greater than or equal to 4 millimeters and less than or equal to 15 millimeters. It should be noted that, the distance between the fins that is greater than or equal to 4 millimeters and less than or equal to 15 millimeters can ensure the heat dissipation efficiency.

In some embodiments, a depth of the set of fins may be a length of a fin in a radial direction of the lidar. FIG. 8 shows a definition of a depth of a fin. In FIG. 8, a length of the fin extending in a radial direction (a direction that the fin passes through the center of the circle) is L.

In some embodiments, the depth of the set of fins may be set according to actual conditions, which is not limited herein.

In some embodiments, the depth of the set of fins may be adaptively selected according to the size of the lidar and the assembly of the emitting lens and the receiving lens, provided that the depth of the set of fins is not so large that the set of fins protrudes beyond peripheral areas of the entire lidar in a radial direction.

It should be noted that, according to experiments, when in the same operational conditions, compared with a conventional lidar (without a set of fins mounted outside a housing chamber), a regional maximum temperature of the lidar provided in the present application can be reduced by as much as 8 degrees Celsius. In addition, an average temperature of the lidar provided in the present application can be reduced by about 10 degrees Celsius compared with that of the conventional lidar. Therefore, the lidar provided in the present application can improve the heat dissipation efficiency.

Apparently, various embodiments can be further implemented by combining different embodiments and various technical features in different manners or modifying them.

The lidar according to the preferred embodiment of the present application, the lidar including the same, and an operation method are described above with reference to the specific embodiments. It may be understood that the foregoing description is merely illustrative but not restrictive, and a person skilled in the art may conceive various variations and modifications with reference to the foregoing description without departing from the scope of the present application. The variations and modifications also shall fall within the protection scope of the present application.

The foregoing descriptions are merely preferred embodiments of the present application and descriptions of the technical principles used. A person skilled in the art should understand that the scope of the present application is not limited to the technical solutions that are formed by the foregoing particular combinations of technical features, but shall also encompass other technical solutions formed by arbitrarily combining the foregoing technical features or equivalent features thereof without departing from the foregoing inventive concept. For example, technical solutions formed by replacing the foregoing features with technical features having similar functions disclosed in the present application (but not limited thereto) are also included.

What is claimed is:

1. A lidar, comprising:
an emitting chamber, wherein components disposed within the emitting chamber comprise at least one first printed circuit board and a film-shaped first heat dissipation component corresponding to the first printed circuit board, wherein a laser emitter is disposed on the first printed circuit board, and the first printed circuit board is configured to drive the laser emitter to emit a laser pulse, wherein the film-shaped first heat dissipation component comprises a thermally conductive assembly portion and at least one heat dissipation assembly portion, and wherein the thermally conductive assembly portion and the at least one heat dissipation assembly portion are not coplanar;
the thermally conductive assembly portion is attached on a back face of the first printed circuit board corresponding to the thermally conductive assembly portion;
at least a portion of the at least one heat dissipation assembly portion is connected to a chamber wall forming the emitting chamber,
wherein the chamber wall forming the emitting chamber comprises a central shaft portion of the lidar, a housing, and an outer housing of the emitting chamber,
wherein the at least one heat dissipation assembly portion comprises a first heat dissipation assembly portion, a second heat dissipation assembly portion, and a third heat dissipation assembly portion, and wherein the thermally conductive assembly portion is not coplanar with the first heat dissipation assembly portion, the second heat dissipation assembly portion, and the third heat dissipation assembly portion;
wherein the first heat dissipation assembly portion is connected to the housing;
wherein the second heat dissipation assembly portion is connected to the central shaft portion of the lidar; and
wherein the third heat dissipation assembly portion is connected to the outer housing of the emitting chamber, and
wherein the first heat dissipation assembly portion, the second heat dissipation assembly portion, and the third heat dissipation assembly portion are respectively connected to different side surfaces of the thermally conductive assembly portion.

2. The lidar according to claim 1, wherein the first heat dissipation assembly portion has a preset angle with the thermally conductive assembly portion and is connected to a first side surface of the thermally conductive assembly portion, wherein the first heat dissipation assembly portion extends in a first direction from the back face of the first printed circuit board to a front face of the first printed circuit board, wherein the first side surface is a side surface on which a first width side of the thermally conductive assembly portion is located, and wherein the first width side is a side of the thermally conductive assembly portion.

3. The lidar according to claim 2, wherein the second heat dissipation assembly portion comprises a first sub-assembly and a second sub-assembly that are mutually connected; wherein
the first sub-assembly has a first preset angle with the thermally conductive assembly portion, and the first sub-assembly is connected to a second side surface of the thermally conductive assembly portion; wherein the first sub-assembly extends in a second direction from the front face of the first printed circuit board to the back face of the first printed circuit board; wherein the second sub-assembly has a second preset angle with the first sub-assembly, and wherein the second side surface is a side surface on which a first side of the thermally conductive assembly portion is located, and the second side surface is perpendicular to the first side surface; and wherein
at least a portion of the second sub-assembly is connected to the central shaft portion of the lidar.

4. The lidar according to claim 3, wherein the third heat dissipation assembly portion comprises a third sub-assembly and a fourth sub-assembly that are vertically connected;
wherein the third sub-assembly is connected to a fourth side surface of the thermally conductive assembly portion, and the fourth side surface is parallel to the first side surface; wherein the third sub-assembly extends in the first direction from the back face of the first printed circuit board to the front face of the first printed circuit board, and the third sub-assembly is perpendicular to the thermally conductive assembly portion;

wherein the fourth sub-assembly is parallel to the thermally conductive assembly portion, and extends in a third direction from the fourth side surface to the first side surface; and wherein at least a portion of the fourth sub-assembly is connected to the outer housing of the emitting chamber.

5. The lidar according to claim 2, wherein there are two or more first printed circuit boards, and wherein the two or more first printed circuit boards are stacked on a same supporting component; and wherein lengths of the first, second and third heat dissipation assembly portions of the film-shaped first heat dissipation components corresponding to the first printed circuit boards are different from each other, the first, second and third heat dissipation assembly portions are stacked, and wherein at least a portion of the first heat dissipation assembly portion is directly connected to the housing.

6. The lidar according to claim 1, wherein a material of the film-shaped first heat dissipation component comprises a graphene film or a copper film.

7. The lidar according to claim 1, wherein the components disposed within the emitting chamber further comprise at least two second printed circuit boards and a second heat dissipation component;

a power supply module for supplying power to the first printed circuit board in claim 1 is disposed on one of the at least two second printed circuit board; and the second heat dissipation component is a thermally conductive gasket, and the thermally conductive gasket is disposed between two directly adjacent printed circuit boards from the at least two second printed circuit boards and configured to conduct heat generated by the at least two second printed circuit board, and is in contact with a heat dissipation structure.

8. The lidar according to claim 7, wherein a material of the thermally conductive gasket is a material of a high thermal conductivity, and the material of the high thermal conductivity comprises graphene and copper.

9. The lidar according to claim 1, wherein the lidar comprises a rotational structure for the optics and the mechanical parts, and the rotational structure for the optics and the mechanical parts comprises a body, the emitting chamber, a receiving portion, and a set of fins, wherein a housing chamber is formed inside the body, the emitting chamber and the receiving portion are disposed within the housing chamber and are fixedly connected to the body of the rotational structure for the optics and the mechanical parts; and wherein the set of fins is disposed on an outer side surface of a chamber body of the housing chamber and is fixedly connected to the body.

10. The lidar according to claim 9, wherein a lens assembly component is disposed on the body, and the lens assembly component is configured to assemble an emitting lens and a receiving lens, and wherein the set of fins is disposed on peripheral areas of the lens assembly component.

11. The lidar according to claim 9, wherein the rotational structure for the optics and the mechanical parts comprises a bottom surface, wherein the set of fins comprises an inclined fin, and wherein a plane in which the inclined fin is located is not parallel to a plane in which the bottom surface is located.

12. The lidar according to claim 11, wherein an angle between the plane in which the inclined fin is located and the plane in which the bottom surface is located has a correlation with a rotation speed of the lidar.

13. The lidar according to claim 9, wherein the rotational structure for the optics and the mechanical parts comprises a bottom surface, wherein the set of fins comprises a lateral fin, and wherein a plane in which the lateral fin is located is parallel to a plane in which the bottom surface is located.

14. The lidar according to claim 9, wherein the body and the set of fins are integrally formed.

15. The lidar according to claim 9, wherein the set of fins comprises at least one subset of fins, wherein fins in each subset of fins are fixedly connected to a plate corresponding to the subset of fins, and wherein the plate is fixedly connected to the body.

16. The lidar according to claim 9, wherein an angle between a rotating shaft of the lidar and outermost two sides of the set of fins correlates to a ratio of an emitting portion and the receiving portion occupying the housing chamber.

17. The lidar according to claim 16, wherein the angle between the rotating shaft of the lidar and the outermost two sides of the set of fins is greater than 90 degrees and less than 300 degrees.

18. The lidar according to claim 9, wherein a spacing between fins in the set of fins is greater than or equal to 4 millimeters and less than or equal to 15 millimeters.

* * * * *